(12) United States Patent
Melius et al.

(10) Patent No.: US 7,235,895 B2
(45) Date of Patent: Jun. 26, 2007

(54) METHOD AND APPARATUS FOR GRAVITY INDUCED THERMAL ENERGY DISSIPATION

(75) Inventors: Jeffrey Alan Melius, Roanoke, VA (US); Cyrus David Harbourt, Roanoke, VA (US); Brian Matthew Aiken, Louisville, KY (US); Christopher Todd Moore, Troutville, VA (US); Howard Ross Edmunds, Roanoke, VA (US); Brian Eric Lindholm, Christiansburg, VA (US); Christopher McMenamin, Salem, VA (US); William John Bonneau, East Troy, WI (US); Amy Marlene Ridenour, Salem, VA (US); Andrew Scott Wilkinson, Pittsburgh, PA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/249,869

(22) Filed: Oct. 13, 2005

(65) Prior Publication Data

US 2007/0085346 A1  Apr. 19, 2007

(51) Int. Cl.
*F03D 11/00* (2006.01)
(52) U.S. Cl. ....................................... 290/55
(58) Field of Classification Search .............. 290/44, 290/55; 257/722
See application file for complete search history.

(56) References Cited

U.S. PATENT DOCUMENTS

| 5,734,553 A | * | 3/1998 | Hong | 361/697 |
| 6,113,351 A | | 9/2000 | McCallum et al. | |
| 6,439,850 B1 | | 8/2002 | McCallum et al. | |
| 6,483,199 B2 | * | 11/2002 | Umemoto et al. | 290/55 |
| 6,520,737 B1 | | 2/2003 | Fischer et al. | |
| 6,644,922 B2 | | 11/2003 | McCallum et al. | |
| 2002/0192078 A1 | | 12/2002 | McCallum et al. | |
| 2003/0067228 A1 | | 4/2003 | Vanjani | |
| 2006/0011336 A1 | | 1/2006 | Frul | |
| 2006/0113804 A1 | * | 6/2006 | Costin | 290/55 |

FOREIGN PATENT DOCUMENTS

| DE | 19636591 A1 | * | 3/1998 |
| JP | 5806977 A | * | 4/1983 |
| WO | WO 02095222 A1 | * | 11/2002 |

\* cited by examiner

*Primary Examiner*—Joseph Waks
(74) *Attorney, Agent, or Firm*—James E. McGinness, Esq.; Armstrong Teasdale LLP

(57) ABSTRACT

A rotor for a wind turbine generator includes a rotatable hub forming a cavity. A plurality of rotor blades is connected to the hub. A heat sink is at least partially positioned within the cavity and extends along a portion of a corresponding rotor blade. The heat sink includes a bottom surface mounted on a thermal energy generating component of the wind turbine generator. An opposing top planar surface includes a plurality of pins extending therefrom. The pins form an air flow path through the pins to dissipate the generated thermal energy from the thermal energy generating component.

20 Claims, 5 Drawing Sheets

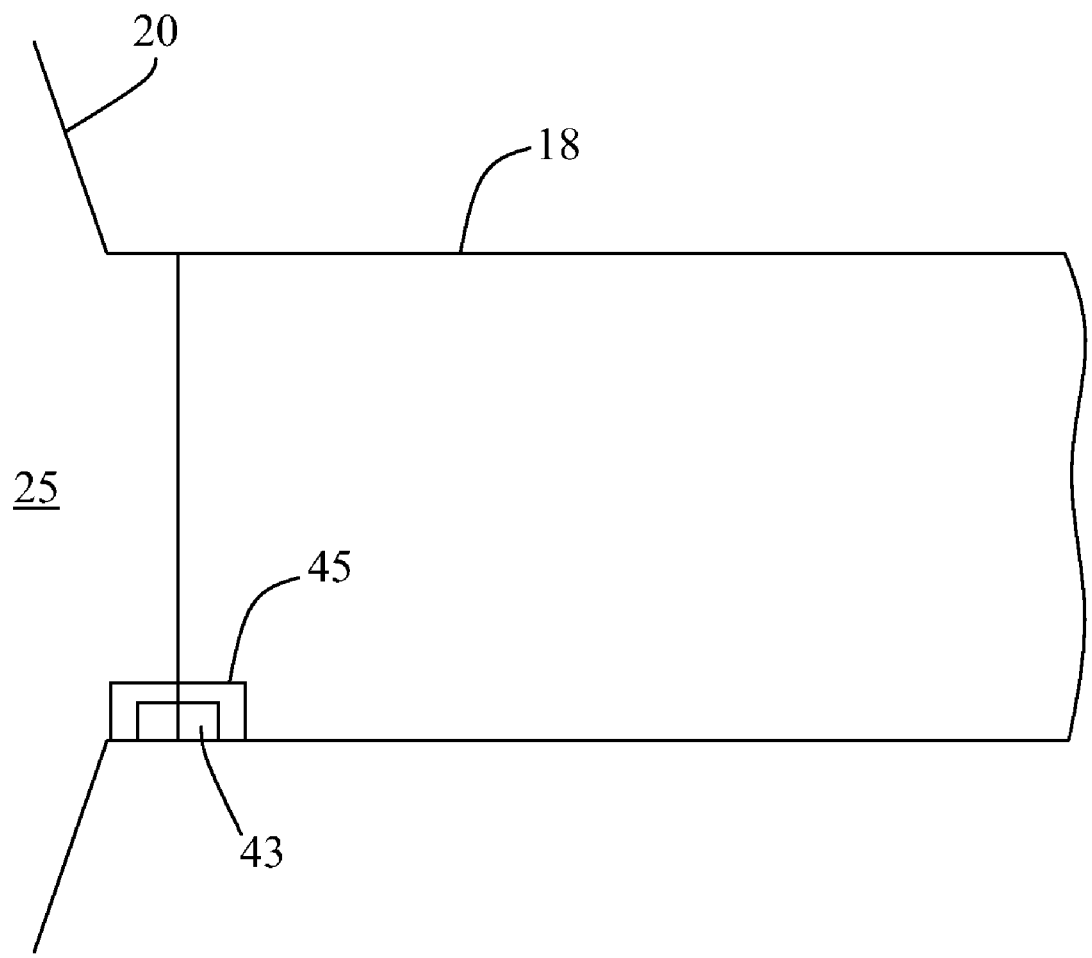
FIG. 2-A

METHOD AND APPARATUS FOR GRAVITY INDUCED THERMAL ENERGY DISSIPATION

BACKGROUND OF THE INVENTION

This invention relates generally to wind turbine generators and, more particularly, to dissipating thermal energy generated by wind turbine generator components.

Recently, wind turbine generators have received increased attention as an environmentally safe and relatively inexpensive alternative energy source. With this growing interest, considerable efforts have been made to develop wind turbine generators that are reliable and efficient.

Generally, a wind turbine generator includes a rotor having multiple blades. The rotor is mounted on a housing or nacelle, which is positioned on top of a truss or tubular tower. Utility grade wind turbine generators (i.e., wind turbine generators designed to provide electrical power to a utility grid) can have large rotors (e.g., 30 or more meters in diameter). Blades on these rotors transform wind energy into a rotational torque or force that drives one or more generators, rotationally coupled to the rotor through a gearbox or directly coupled to the rotor. The gearbox, when present, steps up the inherently low rotational speed of the turbine rotor for the generator to efficiently convert mechanical energy to electrical energy, which is fed into a utility grid.

The varying rotational speed of the rotor and the unpredictable and inconsistent thermal conditions within the hub provide thermal condition problems within wind turbine generators. Heat generators, including heat-sensitive electronic components stored within an enclosure within the hub, typically generate a significant amount of heat during typical wind turbine generator operation. Component life is typically extended if an internal temperature within the enclosure remains below a failure temperature. Conventional cooling systems for the generator components have been developed to counteract the significant amount of heat generated within the hub. Such conventional cooling systems include air cooled ventilation systems and water cooled systems. These conventional systems are typically complex and require additional components to facilitate cooling. Additionally, these conventional systems require maintenance and power to operate. These factors add cost to the operation of the wind turbine generator.

BRIEF DESCRIPTION OF THE INVENTION

In one aspect, the present invention provides a rotor for a wind turbine generator. The rotor includes a rotatable hub forming a cavity. A plurality of rotor blades is connected to the hub. A heat sink is at least partially positioned within the cavity and extends along a portion of a corresponding rotor blade of the plurality of rotor blades. The heat sink includes a bottom surface mounted on a thermal energy generating component of the wind turbine generator. An opposing top planar surface includes a plurality of pins extending from the top planar surface. The pins form an air flow path through the pins to dissipate generated thermal energy from the thermal energy generating component.

In another aspect, the present invention provides a wind turbine that includes a generator. A rotatable hub is operatively connected to the generator and a plurality of rotor blades is mounted to the hub. The wind turbine includes a heat sink system that is mounted with respect to a corresponding rotor blade of the plurality of rotor blades. The heat sink system includes a base having a bottom surface and an opposing top planar surface. A fan shaft is mounted to the top planar surface and defines a rotational axis. A fan is rotatably mounted to the fan shaft and includes a plurality of blades extending radially about said rotational axis. The fan is rotatable to force a flow of cooling air across the top planar surface. A weighted pulley is rotatably mounted to the fan shaft and urges the fan to rotate about the rotational axis as the rotor blade rotates about a rotor shaft. A second pulley is rotatably mounted with respect to the top planar surface and is operatively connected to the weighted pulley.

In a further aspect, the present invention provides a method for dissipating thermal energy to a cavity formed within a wind turbine generator hub. A heat sink is mounted on a surface of a power components enclosure that is positioned within the cavity. The power components enclosure transfers thermal energy to the heat sink. A fan having a plurality of blades is rotatably mounted to a first surface of the heat sink. The fan is urged to rotate with respect to the heat sink surface as the hub rotates to force a flow of air across the heat sink surface and dissipate the thermal energy from the heat sink.

BRIEF DESCRIPTION OF THE DRAWINGS

FIG. 2-A is an enlarged cross-sectional view of the junction between a hub and a rotor blade;

DETAILED DESCRIPTION OF THE INVENTION

The present invention provides a method and apparatus for dissipating thermal energy from a component, such as an electronic power component of a wind turbine generator. The present invention is described below in reference to its application in connection with and operation of a wind turbine generator. However, it will be obvious to those skilled in the art and guided by the teachings herein provided that the invention is likewise applicable to any device or component that generates thermal energy during its operation.

Figure 1:
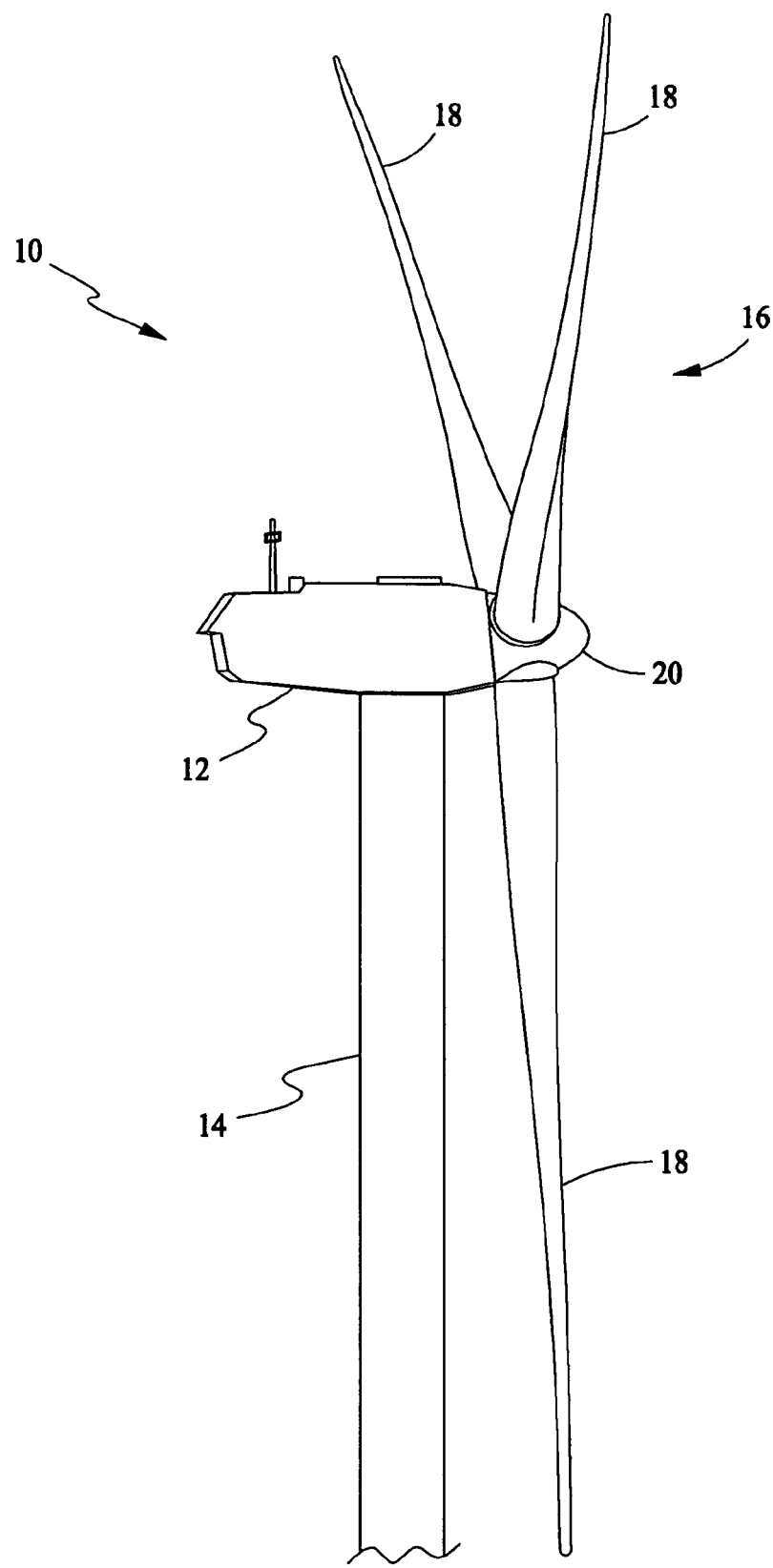
FIG. 1 is an exemplary wind turbine generator.

In one embodiment as shown in FIG. 1, a wind turbine generator 10 includes a nacelle 12 housing a generator (not shown in FIG. 1). Nacelle 12 is mounted atop a tall tower 14, only a portion of which is shown in FIG. 1. Wind turbine generator 10 also includes a rotor 16 that includes a plurality of rotor blades 18 attached to a rotating hub 20. Although wind turbine generator 10 illustrated in FIG. 1 includes three rotor blades 18, there are no specific limits on the number of rotor blades 18 utilized in connection with the present invention.

Figure 2:
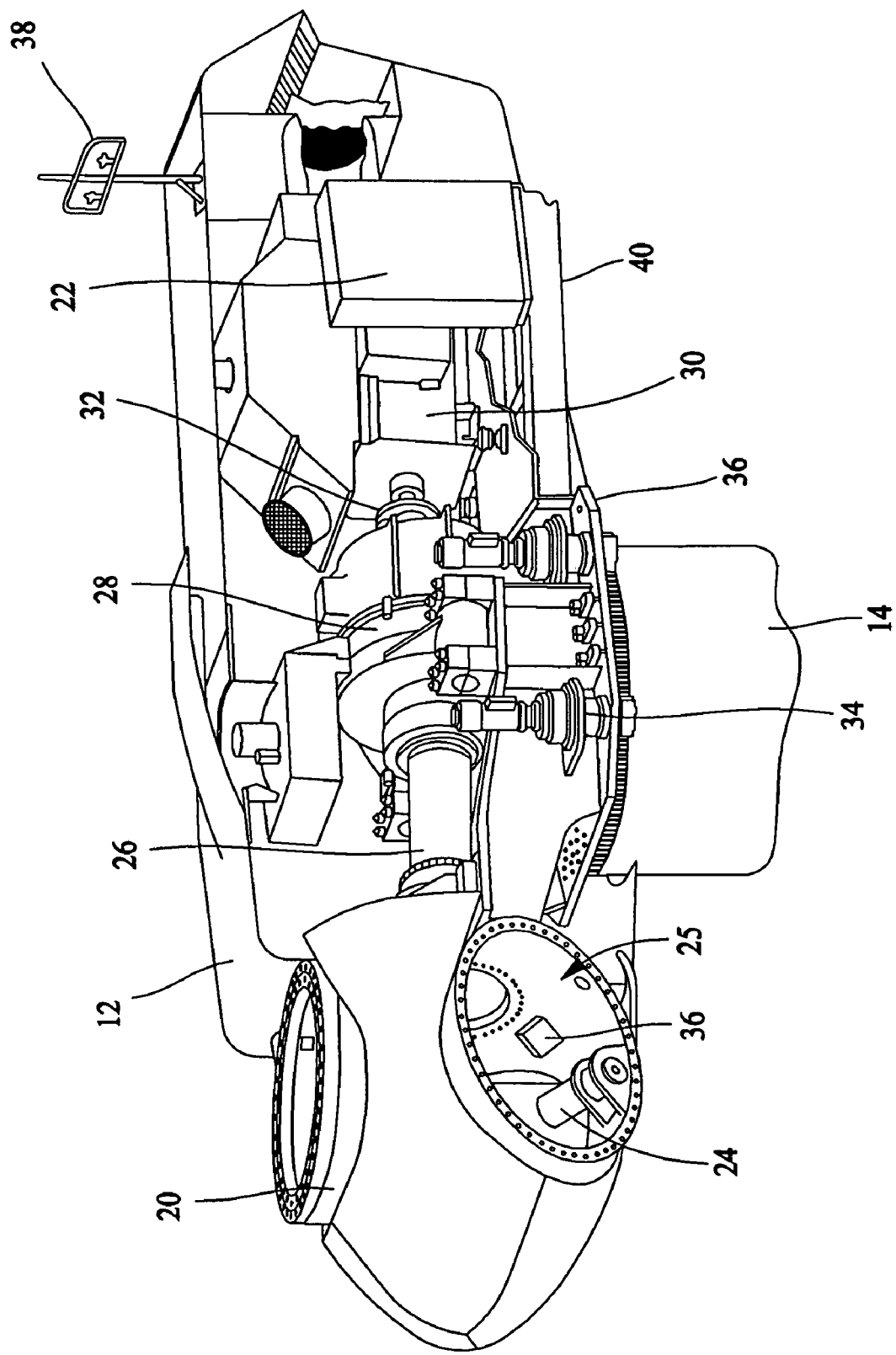
FIG. 2 is a cut-away perspective view of a nacelle of the exemplary wind turbine generator shown in FIG. 1.

Referring further to FIG. 2, various components are housed in nacelle 12 atop tower 14 of wind turbine generator 10. The height of tower 14 is selected based upon factors and conditions known in the art. In one embodiment, a control system including one or more microcontrollers within control panel 22 is used for overall system monitoring and control including pitch and speed regulation, high-speed shaft and yaw brake application, yaw and pump motor application and fault monitoring. Alternative embodiments of wind turbine generator 10 include suitable distributed or centralized control architectures.

In one embodiment, the control system provides control signals to a variable blade pitch drive 24 positioned within a cavity 25 formed by hub 20 (which includes a DC pitch drive motor, not shown in FIG. 2) to control the pitch of blades 18 that drive hub 20 as a result of wind. As shown in FIG. 1, hub 20 receives three blades 18, but other embodiments can utilize any number of blades. A pitch of each blade 18 is individually controlled by blade pitch drive 24.

The drive train of wind turbine generator 10 includes a main rotor shaft 26 (also referred to as a "low speed shaft") connected to hub 20 and a gear box 28 that, in some embodiments, utilizes a dual path geometry to drive a high speed shaft enclosed within gear box 28. The high speed shaft (not shown in FIG. 2) is used to drive a first generator 30 that is supported by main frame 40. In one embodiment, rotor torque is transmitted via coupling 32. First generator 30 may be of any suitable type including, without limitation, a wound rotor induction generator or a multi-pole generator that can run at the speed of the low speed shaft in a direct drive configuration, without requiring a gearbox.

Yaw drive 34 and yaw deck 36 provide a yaw orientation system for wind turbine generator 10. In one embodiment, the yaw orientation system is electrically operated and controlled by the control system in accordance with information received from sensors used to measure shaft flange displacement, for example. Alternately, or in addition to the flange displacement measuring sensors, a wind vane 38 provides information for the yaw orientation system. The yaw orientation system is mounted on a flange provided atop tower 14.

Wind contacts blades 18 and causes wind turbine rotor 16 to rotate about main rotor shaft 26. As rotor 16 rotates, electrical output of wind turbine generator 10 is generated. The generation of electrical output also generates thermal energy including heat within hub 20 and/or nacelle 12, as well as other components of wind turbine generator 10. Increased heat causes degradation in the performance and electrical output of wind turbine generator 10. Additionally, increased heat may lead to failure or damage of wind turbine generator components.

For example, as shown in FIG. 2-A, heat-sensitive electronic power components 43 are mounted with respect to each blade 18. The power components 43 are housed within a suitable enclosure 45, as shown in phantom lines in FIG. 3. Enclosure 45 has suitable dimensions to fully enclose the electronic power components 43 of wind turbine generator 10. A temperature within enclosure 45 is suitably less than about 150° C., and desirably less than about 125° C. to prevent or minimize maintenance and material problems, component degradation and/or failure and ultimately turbine failure as a result of excessive heat within enclosure 45.

At least one heat sink 50 is positioned within cavity 25 to dissipate thermal energy, including heat generated as a result of the wind turbine generator operation. In operation, heat generated within hub 20 during the production of electricity by wind turbine generator 10, as shown in FIG. 1, is dissipated by at least one heat sink 50 mounted with respect to the heat generating components of wind turbine generator 10.

Figure 3:
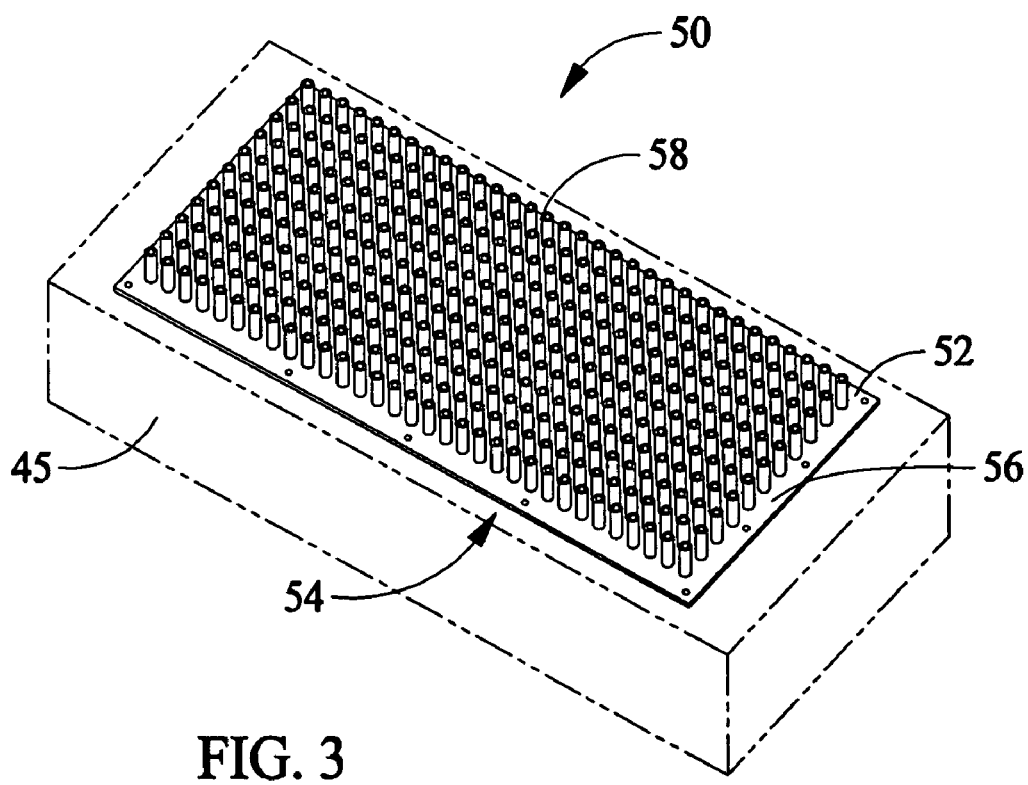
FIG. 3 is a perspective view of an exemplary heat sink of the present invention.

In one embodiment, wind turbine generator 10 includes heat sink 50, such as shown in FIGS. 3-6, attached with respect to each blade 18 to dissipate heat generated within enclosure 45. Heat sink 50 is attached to an outer surface of enclosure 45 to transfer heat from within enclosure 45 to heat sink 50 to maintain a temperature within enclosure 45 below a determined failure temperature. FIG. 3 illustrates a perspective view of an exemplary heat sink 50 including a base 52 having a bottom surface 54 that attaches to the outer surface of enclosure 45 and an opposing top surface 56. In one embodiment, bottom surface 54 and/or top surface 56 has a generally planar configuration. In alternative embodiments, bottom surface 54 and/or top surface 56 has an arcuate configuration to correspond with a surface to which base 52 is mounted.

In one embodiment as shown in FIG. 3, a plurality of pins 58 extend from top surface 56 to dissipate thermal energy to cavity 25. In a particular embodiment, pins 58 are positioned on top surface 56 to increase a surface area of heat sink 50 effective to dissipate thermal energy transferred to heat sink 50 from enclosure 45. Further, pins 58 are positioned with respect to adjacent pins 58 so that air can flow across heat sink 50 in any direction. As a result of pin spacing, an air flow pattern is formed allowing air to flow between adjacent pins 58 in any suitable direction between about 0° and about 360° while maintaining a consistent, predictable thermal performance. In one embodiment, each pin 58 has a generally tubular configuration and a height, width and/or diameter that is equal to adjacent pins 58. Each pin 58 is spaced with respect to adjacent pins 58, based on pin height, width and/or diameter, to form a desired air flow pattern. In alternative embodiments, pin 58 has any suitable configuration, such as a cylindrical or conical configuration, with a suitable cross-sectional shape.

In one embodiment, heat sink 50 including pins 58 is fabricated using an injection casting process. Heat sink 50 and/or pins 58 are fabricated using any suitable material known to those skilled in the art and guided by the teachings herein provided that is fabricated using an injection casting process, and that provide the thermal energy transfer properties required for heat sink 50 and/or pins 58 described herein. Spacing between adjacent pins 58 is based on pin height, pin base diameter and/or pin configuration to provide efficient air flow through pins 58. In an alternative embodiment, base 52 is void of any pins 58.

Figure 4:
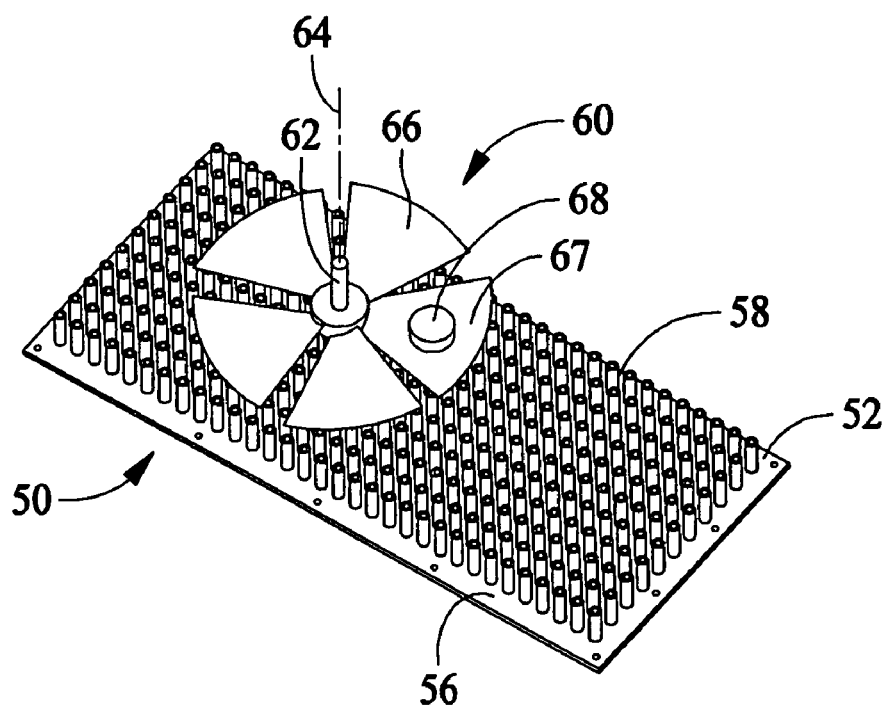
FIG. 4 is a perspective view of an exemplary heat sink system of the present invention.

In one embodiment, a fan 60 is mounted with respect to heat sink 50 and positioned in a spaced relationship with respect to pins 58 to provide for additional thermal dissipation, as desired. As shown in FIG. 4, fan 60 is rotatably mounted on a fan shaft 62 extending from top surface 56. Fan shaft 62 defines a rotational axis 64 about which fan 60 rotates. Fan 60 includes any suitable number of fan blades 66. For example, as shown in FIG. 4, fan 60 includes five fan blades 66 radially positioned about rotational axis 64, but other embodiments can utilize any number of fan blades 66. Fan 60 is positioned such that a suitable distance between a bottom edge of each fan blade 66 and a top surface of each pin 58 is provided for efficient forced air flow between pins 58. A pitch of each fan blade 66 is adjustable to provide forced air cooling based on a rotational speed of wind turbine rotor 16, a rotational speed of fan 60 and/or the pitch of fan blades 66. In alternative embodiments, fan 60 is mounted to top surface 56 that is void of pins 58.

In one embodiment, one blade 67 includes a weight 68. Weight 68 is connected or integrated with blade 67 to counter-weight fan 60. Weighted blade 67 urges fan 60 to rotate towards a surface of the earth as a result of gravity, as rotor 16 rotates about rotor shaft 26. As rotor 16 rotates about rotor shaft 26, counter-weighted fan 60 rotates with respect to top surface 56 of heat sink 50 to force air across top surface 56 and/or between pins 58. As air is forced across top surface 56 and/or between pins 58, heat generated during wind turbine generator operation is transferred from within enclosure 45 into heat sink 50 and through pins 58. The heat is then transferred from heat sink 50 and/or pins 58 into cavity 25 as the forced air flows across heat sink 50 and/or between pins 58.

In contrast to the heat sink system of the present invention, at a constant speed for a suitable time duration, heated air within a hub of a conventional wind turbine generator theoretically rotates with the hub and will not flow across a heat sink. Such state is referred to as "pooling" of heated air. Weighted fan 60 of the present invention counteracts this theoretical state and forces air across heat sink 50 and/or pins 58 to transfer thermal energy from heat sink 50 and/or pins 58 to the forced air and dissipate thermal energy within cavity 25.

Figure 5:
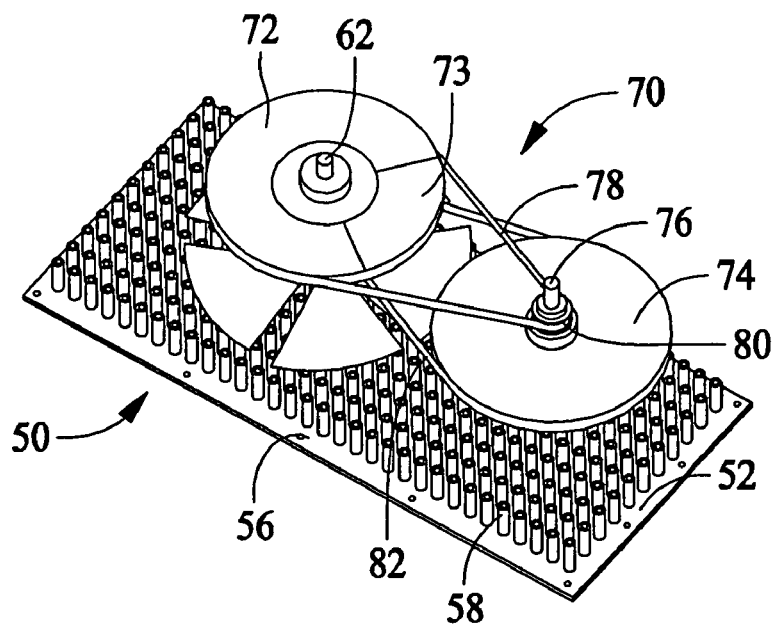
FIG. 5 is a perspective view of an exemplary heat sink system of the present invention.

In one embodiment, additional thermal performance is provided by at least one fan speed multiplier stage 70, as shown in FIG. 5. Fan speed multiplier stage 70 is mounted with respect to top surface 56 and operatively coupled to fan shaft 62 to increase the rotational speed of fan 60, which in turn increases a volume and/or speed of the cooling air forced across heat sink 50 and/or between pins 58. The increased volume and/or speed of the cooling air provides additional thermal performance to heat sink 50. In this embodiment, forced air cooling is provided based upon the rotational speed of wind turbine rotor 16, the rotational speed of fan 60, the pitch of fan blades 66, the number of fan speed multiplier stages 70 incorporated into the heat sink system and/or a pulley or gear ratio of each fan speed multiplier stage 70, as discussed below.

Referring to FIG. 5, fan speed multiplier stage 70 includes a first pulley 72 securely mounted to fan shaft 62. In one embodiment, first pulley 72 is suitably weighted to urge fan 60 to rotate about rotational axis 64 as rotor 16 rotates about rotor shaft 26. For example, as shown in FIG. 5, first pulley 72 includes a weighted section 73. A second pulley 74 is rotatably mounted to top surface 56 and operatively connected to first pulley 72. As shown in FIG. 5, second pulley 74 is rotatably mounted to a shaft 76, which is securely mounted to base 52. A belt 78 couples first pulley 72 to a hub 80 formed on second pulley 74. Similarly, a belt 82 couples second pulley 74 to a hub formed on first pulley 72 (not shown in FIG. 5). Any suitable coupler known to those skilled in the art and guided by the teachings herein provided can be used to operatively couple first pulley 72 to second pulley 74.

As shown in FIG. 5, a circumference of first pulley 72 and/or a circumference of hub 80 are adjustable to provide a pulley ratio, as desired. Similarly, a circumference of second pulley 74 and/or a circumference of the first pulley hub are adjustable to provide a desired pulley ratio. In one embodiment, the pulley ratio, e.g., the circumference of first pulley 72 to the circumference of hub 80 and the circumference of second pulley 74 to the circumference of the first pulley hub, is 8:1. The 8:1 pulley ratio results in a rotational speed of fan 60 of about 120 rpm in relation to a rotational speed of rotor 16 of about 20 rpm. Due to the increased rotational speed of fan 60, an increased air flow rate across heat sink 50 approaches eight times (8×) an air flow rate across heat sink 50 without fan speed multiplier stage 70. In one embodiment, a second fan speed multiplier stage (not shown in FIG. 5) is operatively coupled to fan speed multiplier stage 70 using a suitable coupler, such as discussed above in reference to fan speed multiplier stage 70.

In an alternative embodiment, second pulley 74 includes a gear (not shown in FIG. 5) that interlocks with a gear formed on weighted pulley 72 (not shown in FIG. 5) and operatively connects second pulley 74 to weighted pulley 72. A circumference of the second pulley gear and/or a circumference of the weighted pulley gear is adjustable to provide a gear ratio, as desired.

Figure 6:
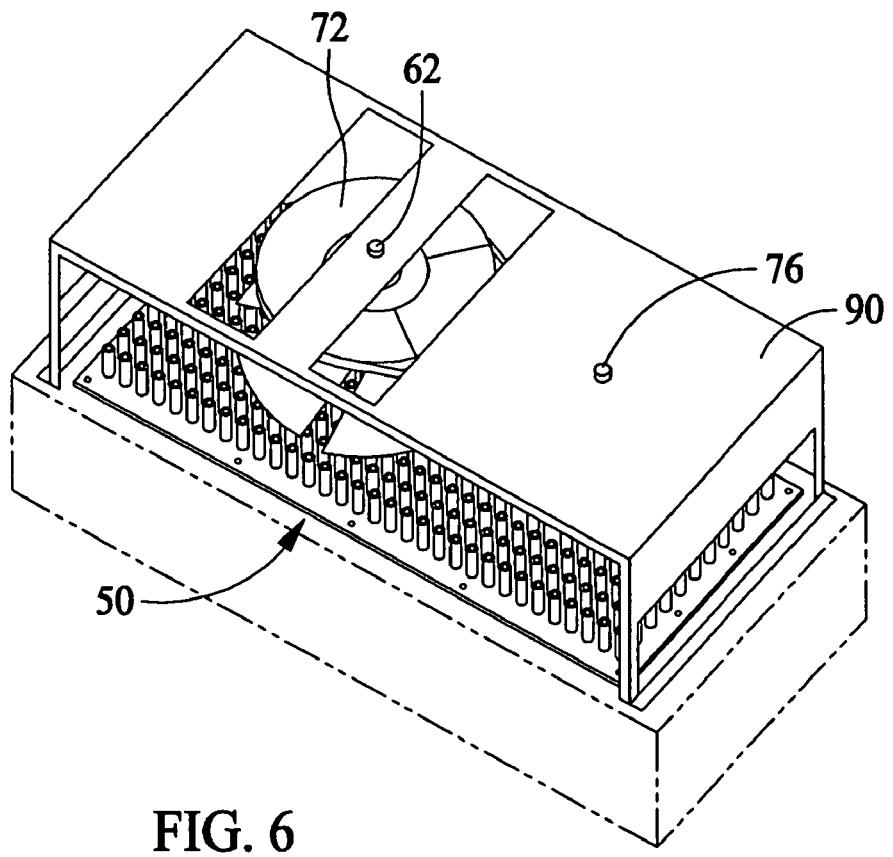
FIG. 6 is a perspective view of an exemplary heat sink system of the present invention.

In one embodiment, the heat sink system of the present invention includes a frame 90 at least partially covering heat sink 50 and top surface 56, as shown in FIG. 6. Frame 90 is fabricated from a suitable sheet metal material and provides support for fan shaft 62 and/or shaft 76. Frame 90 attaches to enclosure 45, shown in phantom lines in FIG. 6, and protects the components of the heat sink system from undesirable contact and/or damage.

A method for dissipating thermal energy to a cavity formed within a wind turbine generator hub according to the present invention includes positioning heat sink 50 on a surface of enclosure 45 that is positioned within cavity 25. In one embodiment, one heat sink 50 is positioned on each of three enclosures 45 at least partially positioned within cavity 25 and extending along a corresponding rotor blade 18. Fan 60 is rotatably mounted to top surface 56 of heat sink 50 and includes a plurality of fan blades 66 positioned radially about fan shaft 62. Fan 60 is urged to rotate with respect to top surface 56 as rotor 16 rotates about rotor shaft 26. A flow of air is forced by the rotation of fan 60 across top surface 56 to dissipate the thermal energy from heat sink 50. In one embodiment, fan 60 includes one weighted blade 67 that urges fan 60 to rotate with respect to top surface 56 in response to a gravity force pulling weighted blade 67 towards the earth, as rotor 16 rotates about rotor shaft 26. The forced air flows between pins 58 extending from top surface 56 and forming an air flow path therebetween. A rotational speed of fan 60 with respect to top surface 56 is increased, as desired, to increase the flow of air across top surface 56 and/or between pins 58. In one embodiment, fan speed multiplier stage 70 provides additional torque on fan shaft 62 to rotate fan 60 about fan shaft 62 at an increased rotational speed.

The above-described method and apparatus of the present invention provide predictable and consistent wind turbine generator thermal performance. More specifically, the method and apparatus efficiently dissipates thermal energy generated within a rotor hub by positioning at least one heat sink with respect to a heat generating component of the wind turbine generator to transfer thermal energy from the heat generating component to a cavity formed within the hub. The heat sink allows for variations in air flow direction with the use of pins extending from a top surface of the heat sink, while maintaining predictable and consistent thermal performance.

Exemplary embodiments of a method, an apparatus and a system for dissipating thermal energy generated by an operating component are described above in detail. The method, apparatus and system are not limited to the specific embodiments described herein, but rather, steps of the method and/or elements or components of the apparatus and system may be utilized independently and separately from others described herein. Further, the described method steps and/or apparatus and system elements or components can also be defined in, or used in combination with, other methods, apparatus and/or systems and are not limited to practice only as described herein.

While the invention has been described in terms of various specific embodiments, those skilled in the art will recognize that the invention can be practiced with modification within the spirit and scope of the claims.

What is claimed is:

1. A rotor for a wind turbine generator, said rotor comprising:
   a rotatable hub forming a first portion of a cavity;
   a plurality of rotor blades connected to the hub, each said rotor blade forming a second portion of the cavity that extends in a direction of a corresponding rotor blade of said plurality of rotor blades; and
   a heat sink at least partially positioned within said cavity, said heat sink comprising:
   a bottom surface mounted on a thermal energy generating component of the wind turbine generator;
   an opposing top planar surface; and
   a plurality of pins extending from said top planar surface and forming an air flow path through said plurality of pins, said heat sink dissipating generated thermal energy from the thermal energy generating component.

2. A rotor in accordance with claim 1 further comprising:
   a fan shaft extending from said top planar surface and defining a rotational axis; and
   a fan rotatably mounted on said fan shaft, said fan including a plurality of blades extending radially about said rotational axis, said fan rotatable to force a flow of cooling air across said top planar surface.

3. A rotor in accordance with claim 2 wherein a pitch of each blade of said plurality of blades is adjustable.

4. A rotor in accordance with claim 2 wherein at least one blade of said plurality of blades is weighted, said at least one weighted blade urging said fan to rotate about said rotational axis as the rotor blade rotates about a rotor shaft.

5. A rotor in accordance with claim 2 further comprising a first fan speed multiplier stage, said first fan speed multiplier stage comprising:
   a weighted pulley rotatably mounted to said fan shaft, said weighted pulley urging said fan to rotate about said rotational axis as the rotor blade rotates about a rotor shaft; and
   a second pulley rotatably mounted to said top planar surface and operatively connected to said weighted pulley.

6. A rotor in accordance with claim 5 wherein said weighted pulley is operatively connected to a hub formed on said second pulley, and a circumference of said weighted pulley is different than a circumference of said hub.

7. A rotor in accordance with claim 5 wherein said second pulley includes a gear that interlocks with a gear formed by said weighted pulley and operatively connects said second pulley to said weighted pulley.

8. A rotor in accordance with claim 7 wherein a circumference of said second pulley gear is different than a circumference of said weighted pulley gear.

9. A rotor in accordance with claim 5 further comprising a second fan speed multiplier stage operatively coupled to said first fan speed multiplier stage.

10. A wind turbine comprising:
    a generator;
    a rotatable hub operatively connected to said generator;
    a plurality of rotor blades mounted to said hub; and
    a heat sink system mounted with respect to a corresponding rotor blade of said plurality of rotor blades, said heat sink system comprising:
    a base having a bottom surface and an opposing top planar surface;
    a fan shaft mounted to said top planar surface and defining a rotational axis;
    a fan rotatably mounted to said fan shaft and including a plurality of blades extending radially about said rotational axis, said fan rotatable to force a flow of cooling air across said top planar surface;
    a weighted pulley rotatably mounted to said fan shaft, said weighted pulley urging said fan to rotate about said rotational axis as the rotor blade rotates about a rotor shaft; and
    a second pulley rotatably mounted with respect to said top planar surface and operatively connected to said weighted pulley.

11. A wind turbine in accordance with claim 10 further comprising a frame at least partially covering said top planar surface, at least one of said fan shaft and said second pulley mounted to said frame.

12. A wind turbine in accordance with claim 10 further comprising a plurality of pins formed on said top planar surface and defining an air flow path through said plurality of pins to dissipate thermal energy within a hub.

13. A wind turbine in accordance with claim 10 wherein one blade of said plurality of blades is weighted, said weighted blade urging said fan to rotate about said rotational axis as the rotor blade rotates.

14. A wind turbine in accordance with claim 10 wherein a diameter of said second pulley is different than a diameter of said weighted pulley.

15. A wind turbine in accordance with claim 10 wherein said second pulley includes a gear that interlocks with a gear formed by said weighted pulley and operatively connects said second pulley to said weighted pulley.

16. A wind turbine in accordance with claim 15 wherein a diameter of said second pulley gear is different than a diameter of said weighted pulley gear.

17. A method for dissipating thermal energy to a cavity formed within a wind turbine generator hub, said method comprises:
    mounting a heat sink on a surface of a power components enclosure within the cavity, wherein the cavity comprises a first portion formed in the hub and a second portion of the cavity that extends in a direction of a corresponding rotor blade, the power components enclosure transferring thermal energy to the heat sink;
    rotatably mounting a fan having a plurality of fan blades to a first surface of the heat sink; rotates; and
    urging the fan to rotate with respect to the first surface as the hub forcing a flow of air across the first surface to dissipate the thermal energy from the heat sink.

18. A method in accordance with claim 17 wherein urging the fan to rotate with respect to the first surface as the hub rotates includes weighting one fan blade of the plurality of fan blades to rotate the fan with respect to the first surface.

19. A method in accordance with claim 17 further comprising increasing a rotational speed of the fan with respect to the first surface to increase the flow of air across the first surface.

20. A method in accordance with claim 17 wherein forcing a flow of air across the first surface further comprises forcing the flow of air between a plurality of pins extending from the first surface and forming an air flow path therebetween.

* * * * *